United States Patent [19]
Pramanick

[11] Patent Number: 6,054,398
[45] Date of Patent: Apr. 25, 2000

[54] SEMICONDUCTOR INTERCONNECT BARRIER FOR FLUORINATED DIELECTRICS

[75] Inventor: Shekhar Pramanick, Fremont, Calif.

[73] Assignee: Advanced Micro Devices, Inc., Sunnyvale, Calif.

[21] Appl. No.: 09/311,735

[22] Filed: May 14, 1999

[51] Int. Cl.[7] .................................................. H01L 24/48
[52] U.S. Cl. .......................... 438/784; 438/758; 438/771; 438/783
[58] Field of Search .................................... 438/758, 771, 438/783, 784

[56] References Cited

U.S. PATENT DOCUMENTS 4,680,612  7/1987  Hieber et al. ............................ 357/71
5,763,010  6/1998  Guo et al. ............................ 427/376.2

*Primary Examiner*—Charles Bowers
*Assistant Examiner*—Lisa Kilday
*Attorney, Agent, or Firm*—Mikio Ishimaru

[57] ABSTRACT

A method is provided for forming tantalum adhesion/barrier layers on semiconductor channels or in vias in low dielectric constant, fluorinated dielectric layers. The dielectric layers are defluorinated using hydrogen, ammonia, methane, or silane plasma and a subsequent tantalum deposition forms a less fluorine reactive tantalum carbide or tantalum silicide. Tantalum or tantalum nitride is then deposited over the less reactive form of tantalum to form the adhesion/barrier for deposition of a subsequent seed layer and a conductive material to form the vias and channels.

11 Claims, 2 Drawing Sheets

SEMICONDUCTOR INTERCONNECT BARRIER FOR FLUORINATED DIELECTRICS

TECHNICAL FIELD

The present invention relates generally to semiconductors and more specifically to adhesion/barrier materials used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metalization" and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which would be fluorinated material with a low dielectric constant (Low K), over the semiconductor devices. A first damascene step photoresist is then placed over the dielectric layer and is photolithographically processed to form the pattern of the first channels. An anisotropic dielectric etch is then used to etch out the channel dielectric layer to form the first channel openings.

The damascene step photoresist is stripped and a thin adhesion/barrier layer is deposited to line the walls of the first channel opening. This adhesion/barrier layer acts as an adhesion/barrier to prevent diffusion of subsequently deposited conductive material into the dielectric layer and the semiconductor devices. It also ensures good adhesion and electrical contact of subsequent layers to the underlying semiconductor devices while improving the formation of subsequently deposited conductive material.

A seed layer is then deposited on the adhesion/barrier layer to act as the "seed" of conductive material for subsequent deposition of the channel conductive material. A first conductive material is then deposited on the seed layer to fill the channels and vias. The adhesion/barrier layer, the seed layer, and the conductive material are subjected to a chemical-mechanical polishing process which removes the layers and material above the first channel dielectric layer and damascenes the first conductive material in the first channel openings to form the first channels.

The via formation step of the dual damascene process starts with the deposition of a thin stop nitride over the first channels and the first channel dielectric layer. Subsequently, a separating dielectric layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an dielectric layer, is then deposited over the via nitride and the exposed dielectric in the via area of the via nitride. A second damascene step photoresist is placed over the second channel dielectric layer and is photolithographically processed to form the pattern of the second channels.

An anisotropic dielectric etch is then used to etch the second channel dielectric layer to form the second channel openings and, during the same etching process to etch the via areas down to the thin stop nitride layer above the first channels to form the vias. The damascene photoresist is then removed, and a nitride etch process removes the nitride above the first channels in the via areas. An adhesion/barrier layer is then deposited to line the vias and the second channel openings. This is followed by a deposition of the seed layer and then the second conductive material in the second channel openings and the vias to form the second channel and the via. A second chemical-mechanical polishing process leaves the two vertically separated, horizontally perpendicular channels connected by cylindrical vias.

The use of the dual damascene technique eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxides. When copper diffuses through dielectrics, it can cause damage to neighboring devices on the semiconductor. To prevent diffusion, materials such as tantalum (Ta), titanium (Ti), and tungsten (W), their alloys, or combinations thereof are used as adhesion/barrier materials for copper. Of these, tantalum is one of the preferred adhesion/barrier materials.

The problem with using tantalum is that it cannot be integrated with fluorinated low dielectric constant dielectric material since tantalum reacts with fluorine at temperatures about and above 250° C. to form tantalum fluoride ($TaF_2$). Since many processing operations take place above 400° C., this means that tantalum can not be used with these dielectrics.

A solution, which would permit the use of a tantalum adhesion/barrier material with fluorinated dielectrics has been long sought, but has eluded those skilled in the art. As the semiconductor industry is moving from aluminum to copper and other type of materials with greater electrical conductivity and thinner channels and vias, it is becoming more pressing that a solution is found.

DISCLOSURE OF THE INVENTION

The present invention provides a method for forming adhesion/barrier layers on semiconductor channels or in vias in low dielectric constant, reactive dielectrics. The adhesion/barrier material is deposited over the semiconductor dielectric in a less reactive form and then deposited in its adhesion/barrier form.

The present invention further provides a method for forming tantalum adhesion/barrier layers on semiconductor channels or in vias in Low K fluorinated dielectrics. The tantalum is deposited in a carbon or silicon-rich ambient to form less reactive tantalum carbide or tantalum silicide, which suppresses or increases the threshold of reaction with fluorine. Tantalum or tantalum nitride is then deposited over the less reactive form of tantalum to form the adhesion/barrier layer.

The present invention further provides a method for forming tantalum adhesion/barrier layers on semiconductor channels or in vias in Low K fluorinated dielectrics. The tantalum is deposited in a carbon hydride or silicon hydride ambient to form less reactive tantalum carbide or tantalum silicide which suppresses or increases the threshold of reaction with fluorine. Tantalum or tantalum nitride is then deposited over the less reactive form of tantalum to form the adhesion/barrier layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
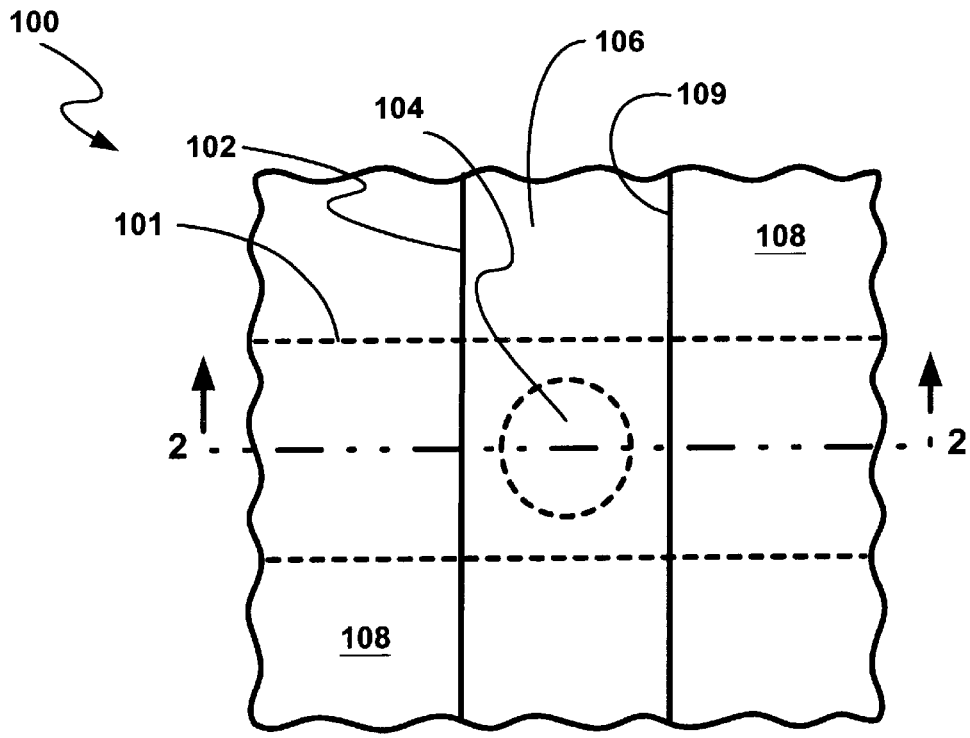
FIG. 1 (PRIOR ART) is a plan view of aligned channels with a prior art via.

Referring now to FIG. 1 (PRIOR ART), therein is shown a plan view of a prior art pair of perpendicularly aligned semiconductor channels of a conductive material such as aluminum or copper disposed on a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 comprises a first conductive material. The second channel 102 is formed by filling a second channel opening 106 disposed in a second channel dielectric layer 108 with a second conductive material. The second channel opening 106 is defined by sidewalls 109 of second channel dielectric layer 108. In the prior art, if the channels were made of copper, the dielectric would be an oxide such as silicon dioxide.

Figure 2:
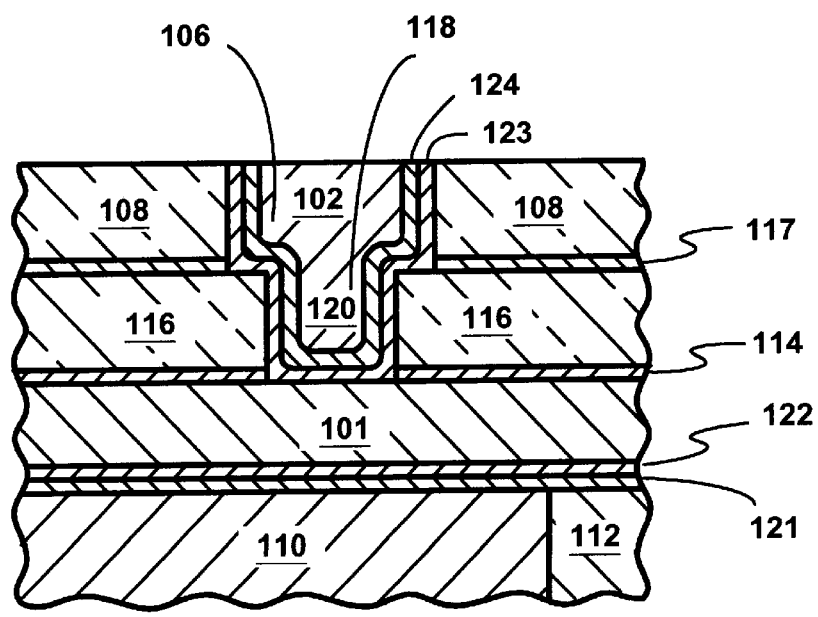
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via dielectric layer 116, and a thin via nitride layer 117. The cross-sectional area of the round via 104 of FIG. 1 (PRIOR ART) defines a cylindrical via opening 118 which becomes cylindrical via 120 when it is filled with the second conductive material.

Also shown disposed around the first channel 101 are an adhesion/barrier layer 121 and seed layer 122, and around the second channel 102 and the cylindrical via 120 are an adhesion/barrier layer 123 and seed layer 124. The adhesion/barrier layer is made up of adhesion/barrier materials such as tantalum, titanium, tungsten, their alloys, and combinations thereof for copper seed layers and copper or copper alloy conductive materials. While the present invention uses a single adhesion/barrier layer, it should be understood that layers of different combinations of adhesion, barrier, and adhesion materials are also encompassed.

Figure 3:
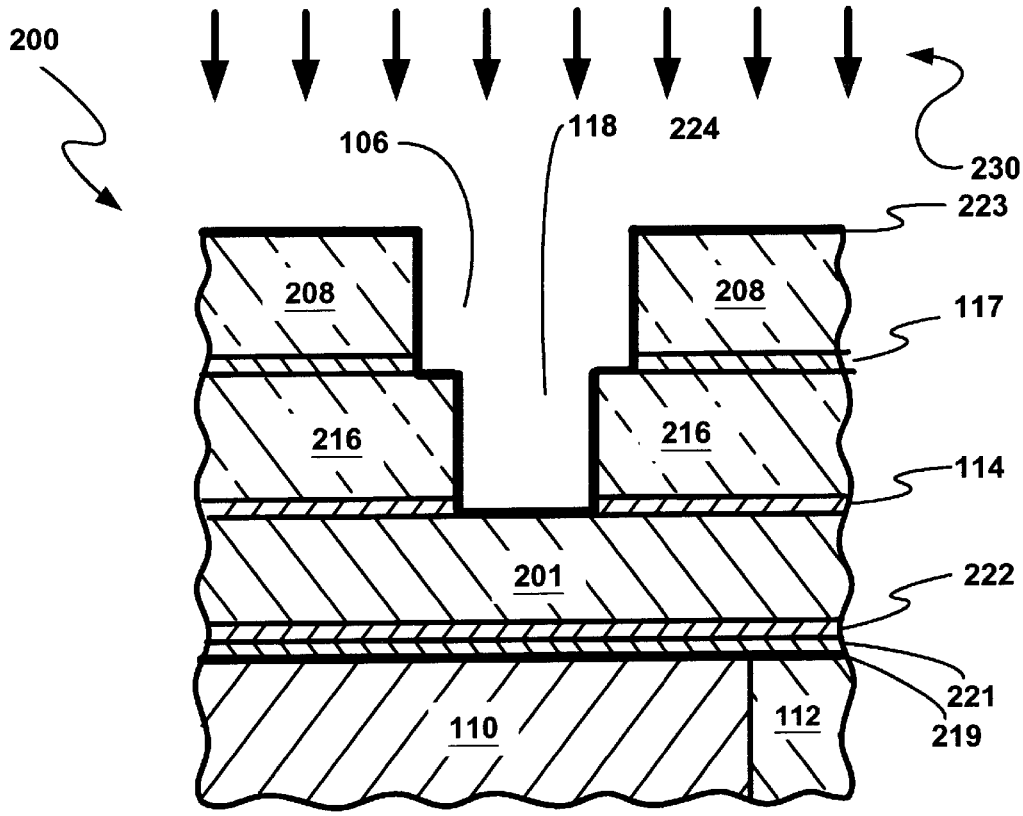
FIG. 3 is a simplified cross-section of a semiconductor wafer during the deposition of the adhesion/barrier material of the present invention.

Referring now to FIG. 3, therein is shown the cross-section of a semiconductor wafer 200 with a pair of perpendicularly aligned semiconductor channels, disposed over a polysilicon gate 110. For convenience of illustration, like reference numerals are used in FIG. 3 to denote like elements already described in FIG. 1 (PRIOR ART) and FIG. 2 (PRIOR ART). Via and second channel dielectric layers 216 and 208, respectively, are of low dielectric constant, fluorinated materials. A first channel 201 of copper is disposed over a less reactive adhesion/barrier material 219, an adhesion/barrier layer 221, and a seed layer 222. The deposition technique for this will be hereinafter described.

A less reactive adhesion/barrier layer 223 is shown by arrows 230 being deposited on the fluorinated via and second channel dielectrics 216 and 208, respectively.

Figure 4:
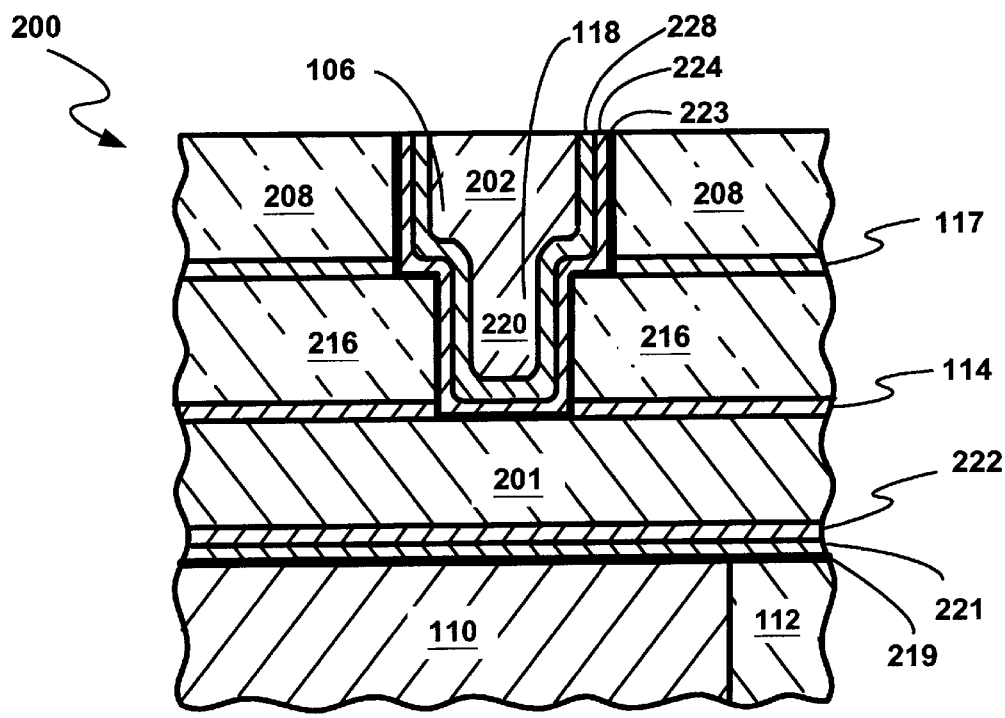
FIG. 4 is a simplified cross-section of the present invention after chemical-mechanical polishing of the second channel.

Referring now to FIG. 4, therein is shown the cross-section of the semiconductor wafer 200 after deposition of the less reactive adhesion/barrier layer 223, an adhesion/barrier layer 224, a seed layer 228, and a conductive material in the second channel 202 and via opening 220. After these depositions, they are chemical-mechanically polished until the surface of the second channel dielectric 208 is exposed and ready for further processing.

In production, a conventional first damascene process is used to dispose a first channel 201 in a first channel dielectric layer (not shown) above portions of a semiconductor device (not shown) on a production semiconductor wafer 200. The damascene process is a photolithographic process which uses a mask to define a first channel opening (not shown) in the first channel dielectric layer. The dielectric as previously described is a low dielectric constant, fluorinated dielectric. The first channel opening is then filled with the less reactive adhesion/barrier layer 219, the adhesion/barrier layer 221 and the seed layer 222. The filling will be hereinafter described in more detail for the second channel 202. A first conductive material, such as copper or a copper alloy, is deposited using conventional metal deposition techniques, such as physical vapor deposition, chemical vapor deposition, electroplating, or a combination thereof to form the first channel 201. The stop nitride layer 114, the via dielectric layer 116, and the via nitride layer 117 would be successively deposited on top of the first channel 201 and the first channel dielectric layer (not shown) using conventional deposition techniques.

By using the via photoresist and the via photolithographic process followed by nitride etching of a round via 104 in the via nitride layer 117, the basis for the cylindrical via opening 118 is formed. The subsequent deposition of the second channel dielectric layer 108 prepared the way for the second channel 106 to be perpendicular to the first channel 201.

The second damascene process uses a further mask to define the second channel opening 106 in the second channel dielectric layer 108. Since the second damascene process uses an anisotropic dielectric etch, the etch also forms the cylindrical via opening 118 down to the stop nitride layer 114. The anisotropic dielectric etch etches faster in the vertical direction of FIG. 3 than in the horizontal direction. The nitride etch of the stop nitride layer 114 exposes a portion of the first channel 201 and completes the etching steps.

Next, it is desirable to remove the fluorine from the surfaces of the fluorinated via and second channel dielectric layers 216 and 208. This can be accomplished in a number of different ways. In one mode, a hydrogen or ammonia ($NH_3$) plasma pretreatment removes surface fluorine down to a depth of 30 to 50 Angstroms and leaves a carbon surface. A subsequent deposition of tantalum in the same PVD/CVD cluster tool used for the plasma treatment will form a surface layer of tantalum carbide (TaC). In a second mode, a methane ($CH_4$) plasma pretreatment removes surface fluorine down to a depth of 20 to 50 Angstroms and also leaves a carbon surface for subsequent deposition of tantalum and formation of tantalum carbide. In a third mode, a silane ($SiH_4$) plasma pretreatment removes surface fluorine to a depth of 10 to 15 Angstroms and leaves a silicon surface for subsequent deposition of tantalum and formation of tantalum silicide.

The tantalum carbide or tantalum silicide is designated as a less reactive adhesion/barrier layer 223 and is about 20 Angstroms thick although the thickness is not critical. After a sufficient thickness of the less reactive adhesion/barrier layer 223 has been deposited to suppress the fluorination of the tantalum or increase the threshold at which the fluorination reaction occurs, the adhesion/barrier layer 224 is deposited. The adhesion/barrier layer 224 can be pure tantalum or a deposition of tantalum in a nitrogen atmosphere which produces tantalum nitride (TaN). The TaN is a superior diffusion barrier material than pure Ta, TaC, or TaSi.

Thereafter, the second conductive material is deposited into second channel opening 106 and cylindrical via opening 118 on top of the adhesion/barrier layer 224 and the seed layer 228 using conventional metal deposition techniques, such as physical vapor deposition, chemical vapor deposition, electroplating, or a combination thereof. Finally, a chemical-mechanical polishing process is used to expose the fluorinated second channel dielectric 208 for further processing.

While the best mode utilizes copper as the conductive material, it should be understood that the present invention is applicable to conductive materials such as copper, aluminum, silver, gold, alloys thereof, and combinations thereof. Similarly, the adhesion/barrier layer can be of tantalum, titanium, tungsten, alloys thereof compounds thereof (especially the nitrides), and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:

providing a semiconductor wafer with a fluorinated dielectric layer formed thereon;

forming an opening in said fluorinated dielectric layer, said opening defined by walls of said fluorinated dielectric layer;

defluorinating said walls of said fluorinated dielectric layer using a plasma;

forming a less fluorine reactive adhesion/barrier layer to line said fluorinated dielectric layer in said opening; and forming an adhesion/barrier layer to line said less fluorine reactive adhesion/barrier layer.

2. The method as claimed in claim 1 wherein the step of forming a less fluorine reactive adhesion/barrier layer uses a material selected from a group consisting of carbon, silicon, and a combination thereof.

3. The method as claimed in claim 1 wherein the step of forming a less fluorine reactive adhesion/barrier layer is performed using plasma selected from a group consisting of hydrogen, ammonia, methane, silane, and a combination thereof.

4. The method as claimed in claim 1 wherein the step of forming a less fluorine reactive adhesion/barrier layer forms a material selected from a group consisting of tantalum, titanium, and tungsten carbides and silicides, and a combination thereof.

5. The method as claimed in claim 1 wherein the step of forming a less fluorine reactive adhesion/barrier layer uses a material selected from a group consisting of tantalum, titanium, tungsten, alloys thereof, and a combination thereof.

6. The method as claimed in claim 1 wherein the step forming said adhesion/barrier layer uses a material selected from a group consisting of tantalum, titanium, tungsten, nitrides thereof, compounds thereof, alloys thereof, and combinations thereof.

7. The method as claimed in claim 1 including a step of forming a seed layer on said adhesion/barrier layer and wherein the step of forming said seed layer uses a material selected from a group consisting of copper, aluminum, silver, gold, alloys thereof, and combinations thereof.

8. The method as claimed in claim 1 including the steps of:

forming a seed layer on said adhesion/barrier layer;

forming a conductive material on said adhesion/barrier layer and filling said opening; and forming said conductive material uses a material selected from a group consisting of copper, aluminum, silver, gold, alloys thereof, and combinations thereof.

9. A method of manufacturing a semiconductor device, comprising the steps of:

providing a semiconductor wafer with a fluorinated dielectric layer formed thereon;

forming an opening in said fluorinated dielectric layer, said opening defined by walls of said fluorinated dielectric layer;

defluorinating said walls of said fluorinated dielectric layer using a plasma selected from a group consisting of hydrogen, ammonia, methane, silane, and a combination thereof;

depositing a less fluorine reactive adhesion/barrier layer to line said fluorinated dielectric layer in said opening, said less fluorine reactive adhesion/barrier layer of a material selected from a group consisting of tantalum carbide, tantalum silicide, and a combination thereof; and forming an adhesion/barrier layer to line said less fluorine reactive adhesion/barrier layer, said adhesion/barrier layer of a material selected from a group consisting of tantalum, tantalum nitride, and a combination thereof.

10. The method as claimed in claim 9 including a step of forming a seed layer on said adhesion/barrier layer and wherein the step of forming said seed layer uses a material selected from a group consisting of copper, aluminum, silver, gold, compounds thereof, alloys thereof, and combinations thereof.

11. The method as claimed in claim 9 including the steps of:

forming a seed layer on said adhesion/barrier layer;
forming a conductive material on said adhesion/barrier layer and filling said opening; and
forming said conductive material uses a material selected from a group consisting of copper, aluminum, silver, gold, compounds thereof, alloys thereof, and combinations thereof.

* * * * *